(12) United States Patent
Oishi

(10) Patent No.: US 7,915,688 B2
(45) Date of Patent: Mar. 29, 2011

(54) SEMICONDUCTOR DEVICE WITH MISFET

(75) Inventor: Amane Oishi, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 12/390,840

(22) Filed: Feb. 23, 2009

(65) Prior Publication Data

US 2009/0159979 A1   Jun. 25, 2009

Related U.S. Application Data

(62) Division of application No. 11/482,120, filed on Jul. 7, 2006, now Pat. No. 7,514,756.

(30) Foreign Application Priority Data

Nov. 11, 2005 (JP) ................................. 2005-327583

(51) Int. Cl.
    *H01L 29/76* (2006.01)
(52) U.S. Cl. ........ 257/382; 257/288; 257/343; 257/584; 257/E21.048; 257/E21.63; 257/E21.432; 257/E21.507; 257/E21.669
(58) Field of Classification Search .................. 257/382, 257/288, 343, 584, E21.048, E21.063, E21.432, 257/E21.507, E21.669
    See application file for complete search history.

(56) References Cited

U.S. PATENT DOCUMENTS

| 6,291,847 B1 | 9/2001 | Ohyu et al. |
| 6,399,993 B1 | 6/2002 | Ohnishi et al. |
| 6,982,465 B2 | 1/2006 | Kumagai et al. |
| 7,109,568 B2 | 9/2006 | Kumagai et al. |
| 7,514,756 B2 * | 4/2009 | Oishi ............................ 257/382 |
| 2003/0181005 A1 | 9/2003 | Hachimine et al. |
| 2004/0029323 A1 | 2/2004 | Shimizu et al. |
| 2004/0075148 A1 | 4/2004 | Kumagai et al. |
| 2004/0217448 A1 | 11/2004 | Kumagai et al. |
| 2004/0251479 A1 | 12/2004 | Tsutsui et al. |
| 2006/0017117 A1 | 1/2006 | Kotani |

FOREIGN PATENT DOCUMENTS

| JP | 61-191047 A | 8/1986 |
| JP | 02-290056 A | 11/1990 |
| JP | 03-096250 A | 4/1991 |
| JP | 03-222457 A | 10/1991 |
| JP | 04-258160 A | 9/1992 |
| JP | 2003-060076 A | 2/2003 |
| JP | 2003-086708 A | 3/2003 |
| JP | 2004-087640 A | 3/2004 |
| JP | 2004-342724 A | 12/2004 |

* cited by examiner

*Primary Examiner* — Long Pham
(74) *Attorney, Agent, or Firm* — Foley & Lardner LLP

(57) ABSTRACT

A semiconductor device includes a substrate, a semiconductor region provided in the substrate, a group of transistors including a plurality of MIS transistors and provided in the semiconductor region, the MIS transistors including a plurality of gate electrodes which extend in a first direction and are provided on the semiconductor region via gate insulation films, an insulation film provided on the group of transistors, and a first contact layer and a second contact layer extending in the first direction and provided on the semiconductor region at opposite sides of the group of transistors.

6 Claims, 6 Drawing Sheets

SEMICONDUCTOR DEVICE WITH MISFET

CROSS-REFERENCE TO RELATED APPLICATIONS

The present application is a Divisional of U.S. application Ser. No. 11/482,120, filed Jul. 7, 2006, which is based upon and claims the benefit of priority from prior Japanese Patent Application No. 2005-327583, filed Nov. 11, 2005, the entire contents of which are incorporated herein by reference.

BACKGROUND OF THE INVENTION

1. Field of the Invention

The present invention relates to a semiconductor device, and more particularly to a semiconductor device in which an insulation film for causing the channel region of a MIS transistor to produce stress is provided on the channel region.

2. Description of the Related Art

Semiconductor devices, which include an Si element region, an element isolation region formed of an insulator and electrically isolating the element region from the other elements, and a metal insulator semiconductor filed effect transistor (MISFET) formed in the element region, are formed of, for example, a plurality of materials that can produce stress of different levels. Because of differences in stress level between the materials, stress occurs in the channel region just below the gate electrode of the MISFET.

In an n-type MISFET, it is known that, in general, when compressive stress occurs in the channel region, the mobility of electrons as carriers is reduced. Further, it is known that in a p-type MISFET, when tensile stress occurs in the channel region, the mobility of holes as carriers is reduced.

In light of the above, a stress film for causing the channel region of the n-type MISFET to produce tensile stress is provided on the n-type MISFET, thereby increasing the degree of mobility of electrons as carriers in the n-type MISFET, and hence enhancing the current driving capacity of the n-type MISFET. Similarly, a stress film for causing the channel region of the p-type MISFET to produce compressive stress is provided on the p-type MISFET, thereby increasing the degree of mobility of holes as carriers in the p-type MISFET, and hence enhancing the current driving capacity of the p-type MISFET.

When such stress films are employed, the stress that occurs in the channel region is influenced not only by the stress film provided on the gate electrode, but also by the stress films provided on the opposite sides of the gate electrode and the stress films provided on the source and drain regions. Accordingly, when a plurality of MISFETs are formed, the stress occurring in each channel region is strongly influenced by the layout of the gate electrodes around it.

The performance of the MISFET significantly depends upon the stress. Therefore, if the stress that occurs in the channel regions of MISFETs significantly differs in level, differences in characteristic between the MISFETs become great, which is not desirable in light of the operation, performance and/or power consumption of the semiconductor device.

Furthermore, a technique related to the above and aiming at enhancement of the mobility of MISFET carriers is disclosed in, for example, Jpn. Pat. Appln. KOKAI Publication No. 2003-60076.

BRIEF SUMMARY OF THE INVENTION

According to a first aspect of the present invention, there is provided a semiconductor device comprising:

a substrate;

a semiconductor region provided in the substrate;

a group of transistors including a plurality of MIS transistors and provided in the semiconductor region, the MIS transistors including a plurality of gate electrodes which extend in a first direction and are provided on the semiconductor region via gate insulation films;

an insulation film provided on the group of transistors; and a first contact layer and a second contact layer extending in the first direction and provided on the semiconductor region at opposite sides of the group of transistors.

According to a second aspect of the present invention, there is provided a semiconductor device comprising:

a substrate;

a semiconductor layer provided on the substrate, extending in a first direction, and including an upper surface and opposite side surfaces;

a group of transistors including a plurality of MIS transistors and provided in the semiconductor layer;

an insulation film provided on the group of transistors; and a first contact layer and a second contact layer provided on the upper surface and the opposite side surfaces of the semiconductor layer at opposite sides of the group of transistors, and extending in a second direction perpendicular to the first direction.

DETAILED DESCRIPTION OF THE INVENTION

Embodiments of the invention will be described in detail with reference to the accompanying drawings. In the following description, elements having the same function are denoted by the same reference number, and no duplicate description is given thereof.

First Embodiment

Figure 1:
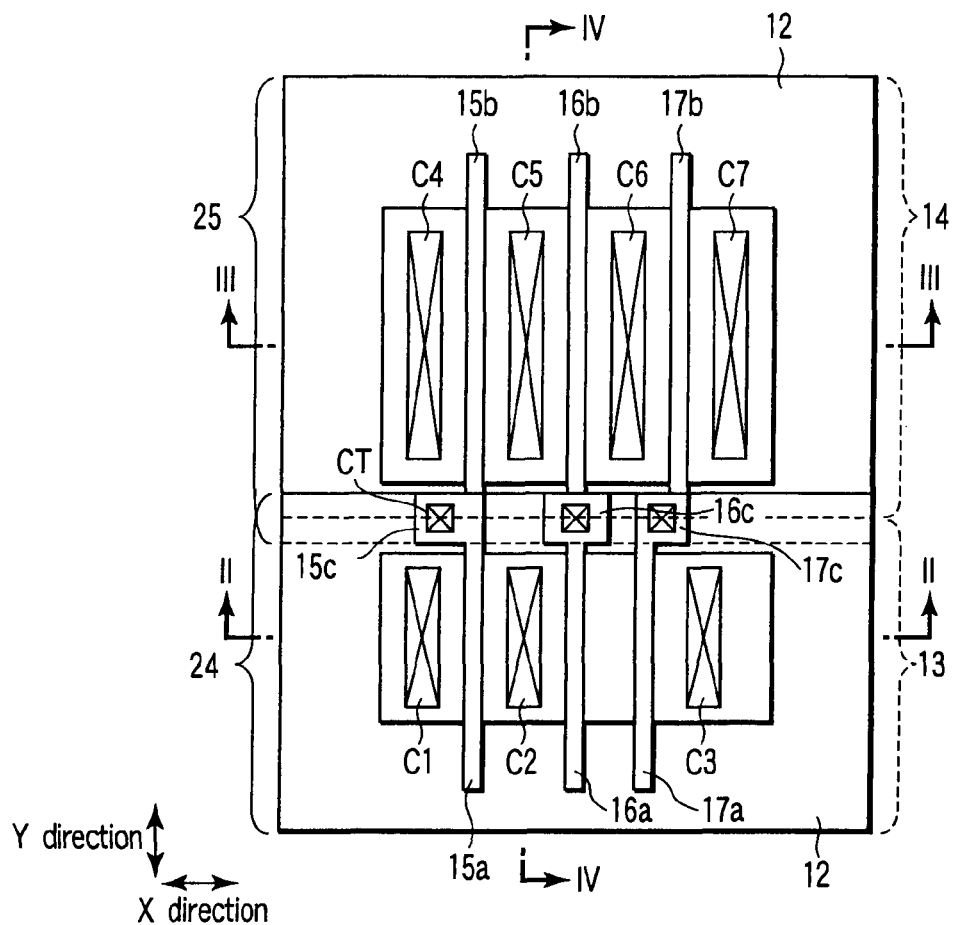
FIG. 1 is a plan view illustrating a semiconductor device according to a first embodiment of the invention.
Figure 2:
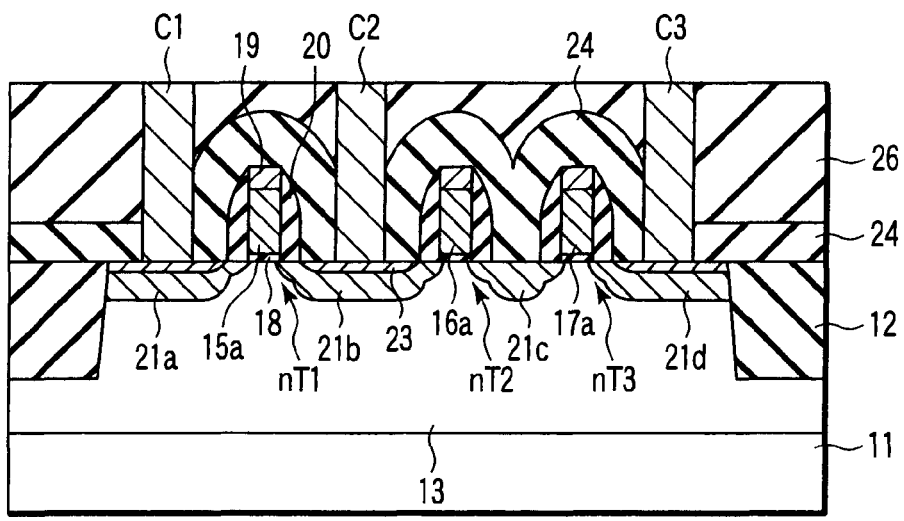
FIG. 2 is a sectional view taken along line II-II in FIG. 1.
Figure 3:
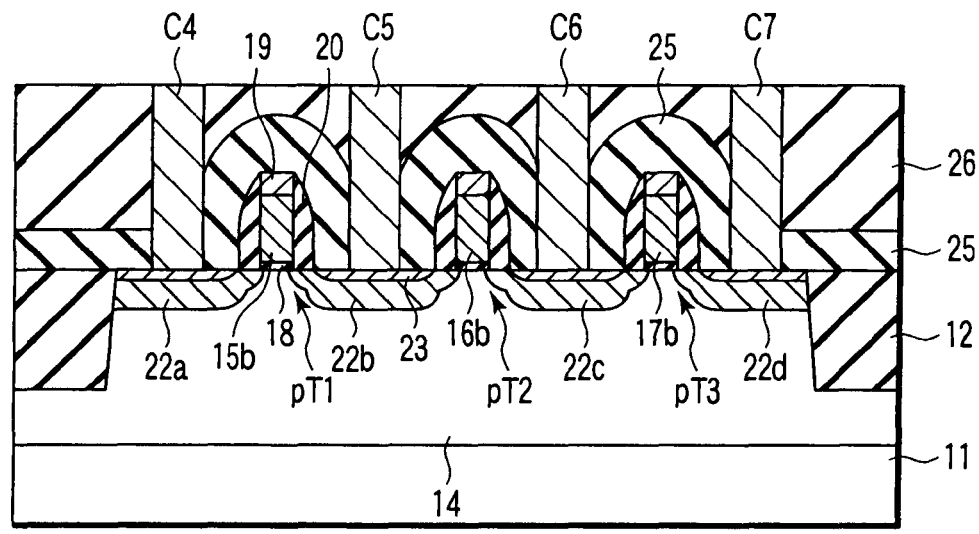
FIG. 3 is a sectional view taken along line III-III in FIG. 1.
Figure 4:
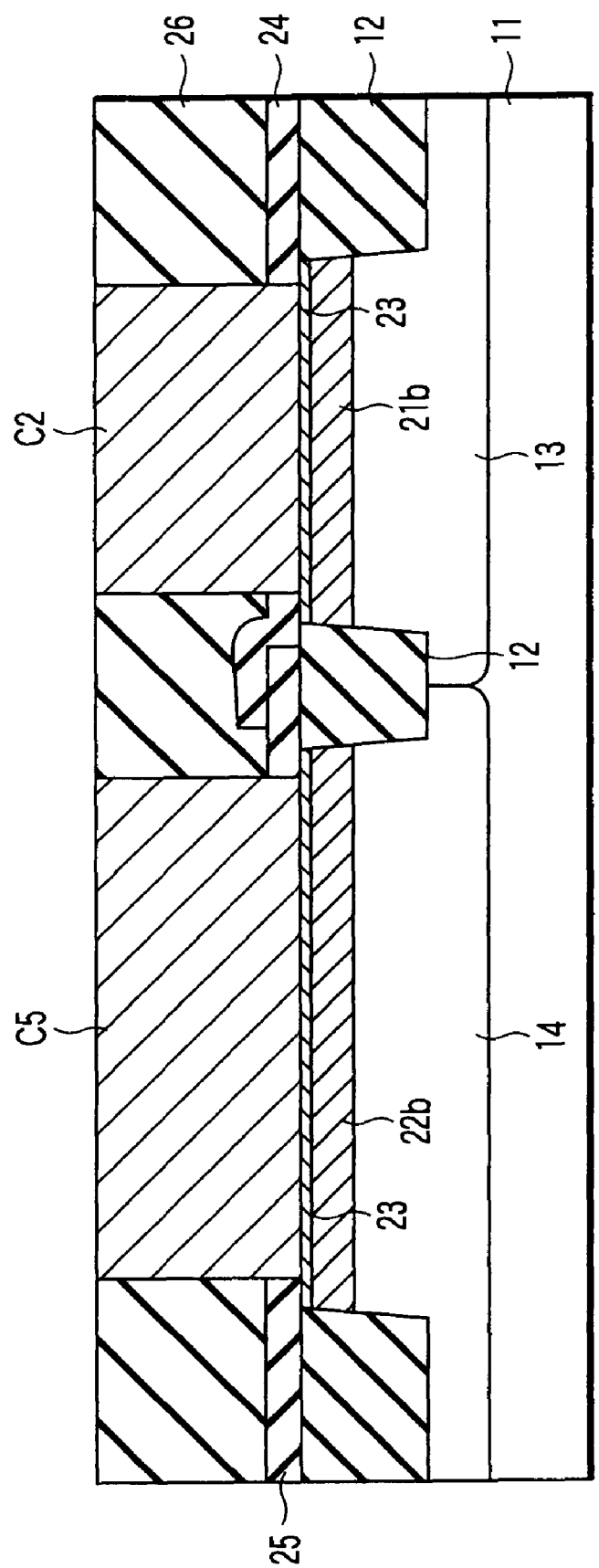
FIG. 4 is a sectional view taken along line IV-IV in FIG. 1.

FIG. 1 is a plan view illustrating a semiconductor device according to a first embodiment of the invention. FIG. 2 is a sectional view taken along line II-II in FIG. 1. FIG. 3 is a sectional view taken along line III-III in FIG. 1. FIG. 4 is a sectional view taken along line IV-IV in FIG. 1. FIG. 1 only shows gate electrodes included in MISFETs. Further, although actually, insulation films, such as stress films, are provided on the gate electrodes and wells, the gate electrodes and wells are indicated by solid lines in FIG. 1 so that their structures will be clearly understood.

As shown, a p-type semiconductor substrate 11 (formed of, for example, Si) includes an element isolation region 12 for electrically isolating a plurality of element regions in which semiconductor elements, such as transistors, are formed. The element isolation region 12 is formed by shallow trench isolation (STI). Specifically, trenches are formed in the semiconductor substrate 11 using lithography or RIE, and then filled with an insulator such as $SiO_2$, thereby forming shallow trenches 12 in the substrate 11.

The semiconductor substrate 11 includes a p-type well 13 formed by introducing a p-type impurity (such as boron (B)) of a low concentration into an arbitrary element region of the substrate. The semiconductor substrate 11 also includes an n-type well 14 formed by introducing an n-type impurity (such as phosphor (P) or arsenic (As)) of a low concentration into an arbitrary element region of the substrate. In the first embodiment, the p-type well 13 and n-type well 14 are located adjacent to each other in the Y direction, with the shallow trenches 12 interposed therebetween.

Three n-type MISFETs nT1, nT2 and nT3 are provided in and on the p-type well 13. Specifically, three gate electrodes 15a, 16a and 17a are provided on the p-type well 13 with respective gate insulation films 18 interposed therebetween, such that they extend in the Y direction. The gate electrodes 15a, 16a and 17a extend between the Y-directional opposite ends of the p-type well 13. The gate electrodes are formed of, for example, polysilicon.

A silicide layer 19 is provided on the gate electrode 15a to reduce the contact resistance of contact layers to be electrically connected to the gate electrode 15a. Gate side-wall insulation films 20 (formed of, for example, $SiO_2$) are provided on the opposite sides of the gate electrode 15a. Source/drain regions 21a and 21b as $n^+$-type diffusion regions, which include lightly doped drain (LDD) regions, are provided in the p-type well 13 at the opposite sides of the gate electrode 15a. The source/drain regions 21a and 21b extend to positions near the Y-directional opposite ends in the p-type well 13.

Respective silicide layers 23 are formed in the source/drain regions. The silicide layers 23 are provided for reducing the contact resistance of the contact layers and diffusion regions. The silicide layers are formed of, for example, Ti silicide.

The n-type MISFET nT1 including the gate electrode 15a is formed as described above. The same can be said of the n-type MISFETs nT2 and nT3. A single source/drain region is used by two adjacent n-type MISFETs. Namely, the n-type MISFET nT2 comprises the gate electrode 16a and source/drain regions 21b and 21c. The n-type MISFET nT3 comprises the gate electrode 17a and source/drain regions 21c and 21d.

Three p-type MISFETs pT1, pT2 and pT3 are provided in and on the n-type well 14. Specifically, three gate electrodes 15b, 16b and 17b are provided on the n-type well 14 with respective gate insulation films 18 interposed therebetween, such that they extend in the Y direction. The gate electrodes 15b, 16b and 17b extend between the Y-directional opposite ends of the n-type well 14.

A silicide layer 19 is provided on the gate electrode 15b. Gate side-wall insulation films 20 are provided on the opposite sides of the gate electrode 15b. Source/drain regions 22a and 22b as $p^+$-type diffusion regions, which include LDD regions, are provided in the n-type well 14 at the opposite sides of the gate electrode 15b. The source/drain regions 22a and 22b extend to positions near the Y-directional opposite ends in the n-type well 14.

The p-type MISFET pT1 including the gate electrode 15b is formed as described above. The same can be said of the p-type MISFETs pT2 and pT3. A single source/drain region is used by two adjacent p-type MISFETs. Namely, the p-type MISFET pT2 comprises the gate electrode 16b and source/drain regions 22b and 22c. The p-type MISFET pT3 comprises the gate electrode 17b and source/drain regions 22c and 22d.

The electrodes 15a and 15b are connected via a conductive layer 15c. The electrodes 16a and 16b are connected via a conductive layer 16c. The electrodes 17a and 17b are connected via a conductive layer 17c. The conductive layers 15c, 16c and 17c are formed of the same material as the gate electrodes. Contact layers CT are connected to the conductive layers 15c, 16c and 17c. Namely, the conductive layers 15c, 16c and 17c are provided to allow for a margin of misalignment of the contact layers CT when they are formed. The potential of the gate electrodes are kept at a certain level via the contact layers CT.

A stress film 24 for causing the channel regions of the n-type MISFETs to produce tensile stress is provided on the p-type well 13 to cover the n-type MISFETs.

The stress film 24 is formed of, for example, SiN. To form the stress film 24, firstly, SiN is deposited by plasma enhanced chemical vapor deposition (PECVD). After that, the deposited SiN is contracted by dehydrogenation. The thus formed SiN film causes the channel regions to produce tensile stress. The stress film 24 may be formed of a material causing intrinsic tensile stress (residual stress). Further, the material of the stress film 24 is not limited to SiN.

Thus, the stress film 24 provided on each n-type MISFET causes the channel region just below the gate electrode 15a (16a, 17a) to produce tensile stress. When the channel region just below the gate electrode 15a (16a, 17a) produces tensile stress, the mobility of carriers (electrons) in the n-type MISFET is enhanced, thereby enhancing the current driving capacity of the n-type MISFET.

A stress film 25 for causing the channel regions of the p-type MISFETs to produce compressive stress is provided on the n-type well 14 to cover the p-type MISFETs.

The stress film 25 is formed of, for example, SiN. To form the stress film 25, SiN of high density is deposited by PECVD. The thus formed SiN film causes the channel regions to produce compressive stress. The stress film 25 may be formed of a material causing intrinsic compressive stress. Further, the material of the stress film 25 is neither limited to SiN.

Thus, the stress film 25 provided on each p-type MISFET causes the channel region just below the gate electrode 15b (16b, 17b) to produce compressive stress. When the channel region just below the gate electrode 15b (16b, 17b) produces compressive stress, the mobility of carriers (holes) in the p-type MISFET is enhanced, thereby enhancing the current driving capacity of each p-type MISFET.

Y-directionally extending contact layers C1, C2 and C3 are provided on the source/drain regions of the n-type MISFETs. The contact layers C1, C2 and C3 are formed of, for example, tungsten (W). It is desirable to set the Y-directional length of the contact layers C1, C2 and C3 longer than the channel width of the n-type MISFETs.

In the first embodiment, the contact layers C1, C2 and C3 extend to positions near the Y-directional opposite ends of the p-type well 13. In other words, the contact layers C1, C2 and C3 extend to positions near the Y-directional opposite ends of the source/drain regions of the n-type MISFETs.

It is desirable that the contact layers C1, C2 and C3 should extend to the Y-directional opposite ends of the source/drain regions of the n-type MISFETs. Actually, however, it is necessary to allow for variations in the source/drain region forming process or a margin of, for example, misalignment of the contact layers. Therefore, the contact layers C1, C2 and C3 are extended to positions near the Y-directional opposite ends of the source/drain regions of the n-type MISFETs. FIG. 1 shows the case where the contact layers C1, C2 and C3 extend to positions near the Y-directional opposite ends of the p-type well 13 (i.e., the distance between each Y-directional end of the p-type well 13 and the contact layer C1 (C2, C3) is used as a margin of misalignment due to the manufacturing process).

The width of the contact layers C1, C2 and C3 is not limited. It may be equal to or greater than the gate length. The width of the contact layers C1, C2 and C3 is determined in light of the manufacturing process, cost, etc.

The contact layers C1, C2 and C3 have, for example, a rectangular planar configuration. The height of the contact layers C1, C2 and C3 is set at least higher than the upper surface of the stress film 24.

The contact layer C1 partitions the portion of the stress film 24 that is located on the source/drain region 21a. The contact layer C2 partitions the portion of the stress film 24 that is located on the source/drain region 21b between the gate electrodes 15a and 16a. The contact layer C3 partitions the portion of the stress film 24 that is located on the source/drain region 21d.

The distance between the gate electrodes 16a and 17a is shorter than that between the gate electrodes 16a and 15a, therefore no contact layers for dividing the stress film 24 are provided on the source/drain region 21c. This is because the tensile stress caused by the portion of the stress film 24 that is located on the source/drain region 21c is substantially the same as that produced in the other source/drain regions.

From, for example, the design rule corresponding to the generation of the semiconductor device, it is determined whether a contact layer is provided between gate electrodes. The design rule is determined based on the minimum processing size of gate electrodes that is determined from the accuracy of the exposure apparatus employed in the manufacturing process. Accordingly, when the distance of two gate electrodes is greater than the minimum distance (i.e., the distance between two gate electrodes of the minimum processing size), a contact layer is provided between the gate electrodes to partition the stress film.

Alternatively, a contact layer for dividing the stress film may be provided between gate electrodes, if the distance between the gate electrodes is larger than a preset value. The preset value is determined based on whether the stress that the stress film provided on the source/drain region between the gate electrodes causes the channel region to produce is greater than the optimal stress for enhancing the mobility of carriers. If the stress is greater than the optimal one, a contact layer is provided between the gate electrodes for dividing the stress film.

Thus, the n-type MISFETs nT1, nT2 and nT3 provided in and on the p-type well 13 can cause their respective channel regions to produce substantially equal tensile stress. As a result, the mobility of carriers (electrons) in the n-type MISFETs can be substantially equally enhanced, thereby substantially equally enhancing the current driving capacity of the n-type MISFETs.

Y-directionally extending contact layers C4, C5, C6 and C7 are provided on the source/drain regions of the p-type MISFETs. It is desirable to set the Y-directional length of the contact layers C4, C5, C6 and C7 longer than the channel width of the p-type MISFETs.

In the first embodiment, the contact layers C4, C5, C6 and C7 extend to positions near the Y-directional opposite ends of the n-type well 14. In other words, the contact layers C4, C5, C6 and C7 extend to positions near the Y-directional opposite ends of the source/drain regions of the p-type MISFETs. The distance between each Y-directional end of the n-type well 13 and the contact layer C4 (C5, C6, C7) is used as a margin of misalignment due to the manufacturing process. Further, the height of the contact layers C4, C5, C6 and C7 is set at least higher than the upper surface of the stress film 25.

The gate electrodes 15b, 16b and 17b are provided at regular distances on the n-type well 14. Accordingly, the contact layers C4, C5, C6 and C7 are provided to partition those portions of the stress film 25 which are located on the respective source/drain regions.

Specifically, the contact layer C4 partitions the portion of the stress film 25 that is located on the source/drain region 22a. The contact layer C5 partitions the portion of the stress film 25 that is located on the source/drain region 22b between the gate electrodes 15b and 16b. The contact layer C6 partitions the portion of the stress film 25 that is located on the source/drain region 22c between the gate electrodes 16b ad 17b. The contact layer C7 partitions the portion of the stress film 25 that is located on the source/drain region 22d.

As described above, the p-type MISFETs pT1, pT2 and pT3 provided in and on the n-type well 14 can cause their respective channel regions to produce substantially equal compressive stress. As a result, the mobility of carriers (holes) in the p-type MISFETs can be substantially equally enhanced, thereby substantially equally enhancing the current driving capacity of the p-type MISFETs.

Further, in the p-type MISFETs, the distance between each gate electrode and the corresponding contact layer is set to the minimum distance (minimum pitch), with the result that the channel regions can produce equal compressive stress.

As described in detail, in the first embodiment, since the channel region of each n-type MISFET is made to produce tensile stress, the mobility of carriers (electrons) is enhanced, thereby enhancing the current driving capacity of each n-type MISFET. Similarly, since the channel region of each p-type MISFET is made to produce compressive stress, the mobility of carriers (holes) is enhanced, thereby enhancing the current driving capacity of each p-type MISFET.

The degree of stress produced in each channel region varies with the layout of gate electrodes (i.e., the distance between each pair of adjacent gate electrodes). Namely, if the distance between adjacent gate electrodes is large, the number of stress films provided therebetween is increased. In contrast, if the distance is small, the number of stress films is reduced. Thus, the stress produced by each channel region strongly depends upon the layout of gate electrodes. As a result, the characteristic of each MISFET strongly depends upon the layout of gate electrodes.

However, in the first embodiment, the stress film is appropriately partitioned to enable substantially equal stress to be produced by the channel regions of all MISFETs, using contact layers connected to the source/drain regions. Thus, the channel regions of all MISFETs can produce substantially equal stress, which reduces the degree of dependence of the characteristic of the MISFETs upon the layout of the gate electrodes.

In addition, contact layers are used to partition the stress film. That is, no particular layers are necessary for dividing the stress film, which suppresses the size of the semiconductor device.

Since the contact layers have a large area, they only show low wiring resistance.

Second Embodiment

In a second embodiment, contact layers for dividing the stress film 24 are provided on the X-directional opposite ends of the p-type well 13, thereby making a plurality of n-type MISFETs on the p-type well 13 have a substantially equal characteristic.

Figure 5:
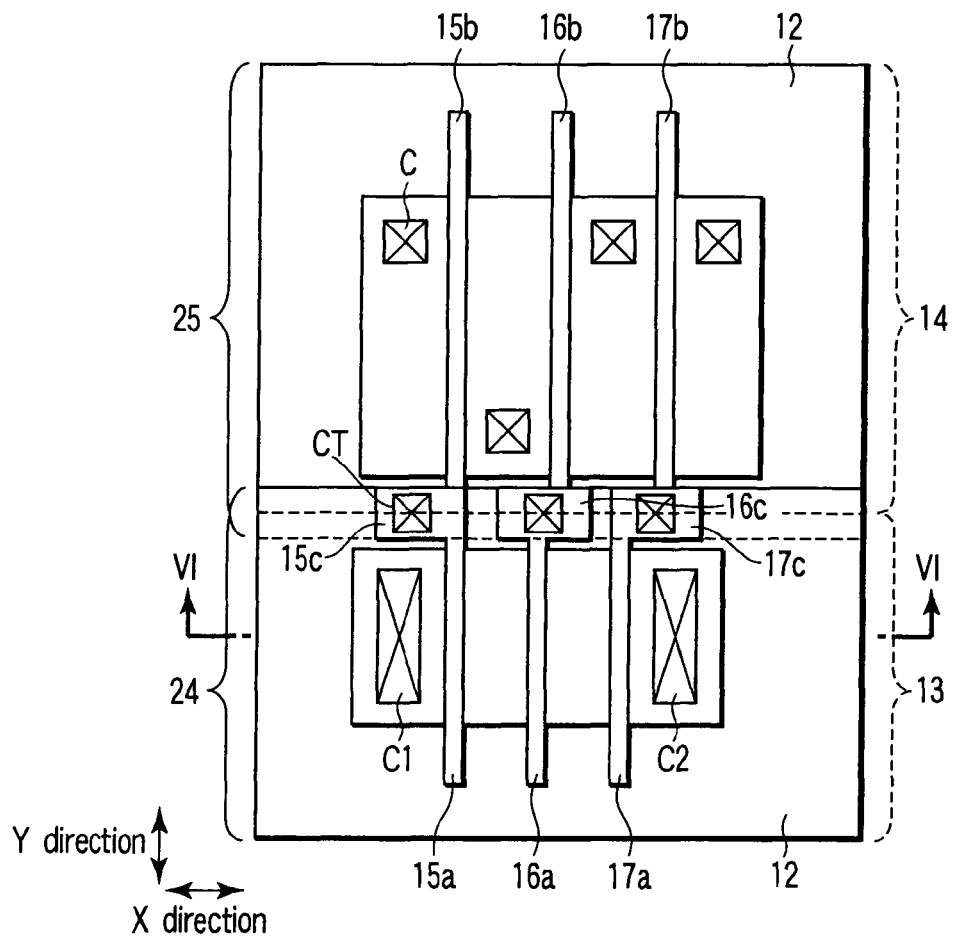
FIG. 5 is a plan view illustrating a semiconductor device according to a second embodiment of the invention.
Figure 6:
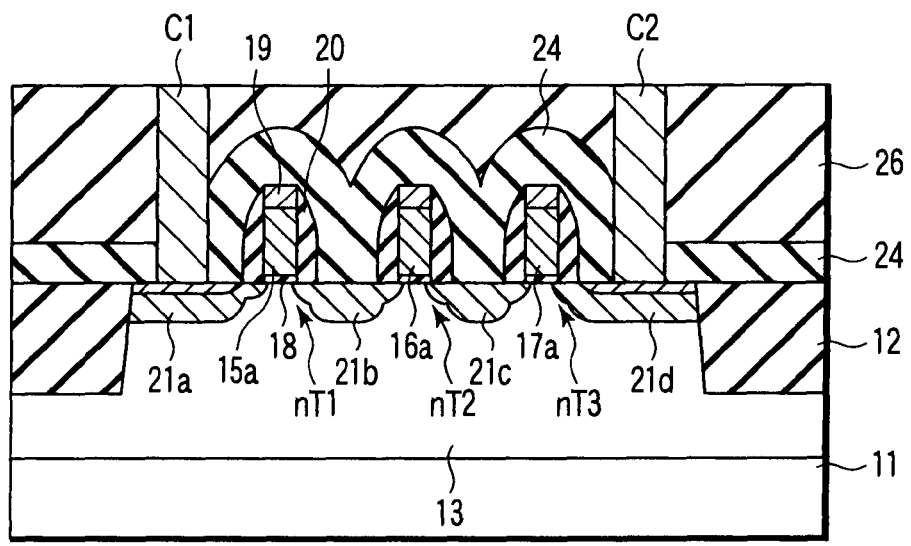
FIG. 6 is a sectional view taken along line V-V in FIG. 5.

FIG. 5 is a plan view illustrating the semiconductor device of the second embodiment. FIG. 6 is a sectional view taken along line VI-VI in FIG. 5. FIG. 5 only shows the gate electrodes of the MISFETs.

Three n-type MISFETs nT1, nT2 and nT3 are provided in and on the p-type well 13. The MISFETs nT1, nT2 and nT3 include gate electrodes 15a, 16a and 17a extending in the Y direction on the p-type well 13 with gate insulation films 18 interposed therebetween. The gate electrodes 15a, 16a and 17a are arranged with the minimum distance (minimum pitch) based on the manufacturing process.

Contact layers C1 and C2 are provided on the X-directional opposite ends of the p-type well 13 to interpose the gate electrodes 15a, 16a and 17a therebetween. Specifically, the contact layer C1 is provided on a source/drain region 21a located at one end of the p-type well 13, while the contact layer C2 is provided on a source/drain region 21d located at the other end of the p-type well 13. The height of the contact layers C1 and C2 is set at least higher than the upper surface of the stress film 24.

The contact layers C1 and C2 extend in the Y-direction. It is desirable to set their Y-directional length greater than the channel width of the n-type MISFETs.

In the second embodiment, the contact layers C1, and C2 extend to positions near the Y-directional opposite ends of the p-type well 13. In other words, the contact layers C1 and C2 extend to positions near the Y-directional opposite ends of the source/drain regions of the n-type MISFETs. The distance between each Y-directional end of the n-type well 13 and the contact layer C1 is used as a margin of misalignment due to the manufacturing process.

The contact layer C1 partitions the portion of the stress film 24 that is located on the source/drain region 21a. The contact layer C2 partitions the portion of the stress film 24 that is located on the source/drain region 21d.

In the semiconductor device constructed as above, the channel regions of the n-type MISFETs nT1, nT2 and nT3 provided in and on the p-type well 13 produce tensile stress of substantially the same level. As a result, the mobility of carriers (electrons) in the n-type MISFETs can be substantially equally enhanced, thereby substantially equally enhancing the current driving capacity of the n-type MISFETs.

Even if the gate electrodes 15a, 16a and 17a are not arranged with the minimum distance, the second embodiment is applicable. In the p-type well 13, the stress film 24 causes the X-directional opposite ends to produce great stress. This is because on the X-directional opposite ends, there are no elements that interrupt the influence of the stress film. Accordingly, the contact layers C1 and C2 provided on the X-directional opposite ends of the well 13 can reduce the degree of inequality of stress that occurs in the channel regions of the n-type MISFETs.

Further, it is a matter of course that the second embodiment is also applicable to the p-type MISFETs formed in and on the p-type well 14.

Third Embodiment

In a third embodiment, a plurality of contact layers are used to partition the portion of the stress film 24 that is located on an arbitrary source/drain region.

Figure 7:
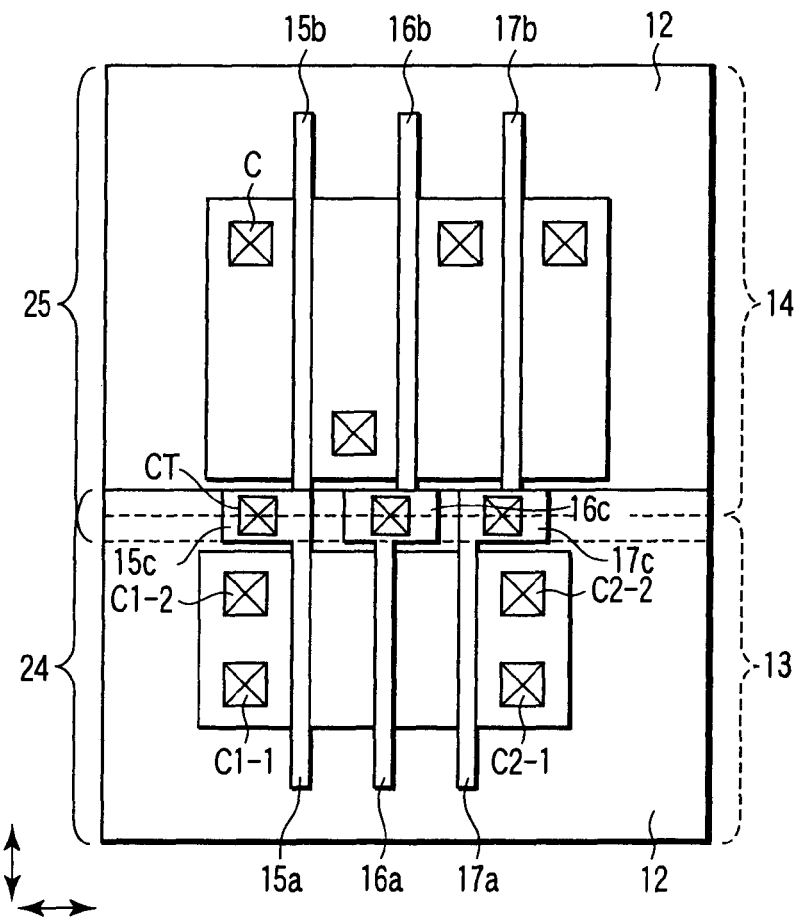
FIG. 7 is a plan view illustrating a semiconductor device according to a third embodiment of the invention.

FIG. 7 is a plan view illustrating a semiconductor device according to the third embodiment of the invention. FIG. 7 only shows gate electrodes incorporated in the MISFETs.

Three n-type MISFETs nT1, nT2 and nT3 are provided in and on the p-type well 13. Gate electrodes 15a, 16a and 17a incorporated in the n-type MISFETs nT1, nT2 and nT3 are provided on the p-type well 13 with gate insulation films 18 interposed therebetween, such that they extend in the Y direction. The gate electrodes 15a, 16a and 17a are arranged with the minimum distance determined based on the manufacturing process.

Two contact layers C1-1 and C1-2 are provided on the source/drain region 21a of the p-type well 13 that is located at one end of the well 13. Namely, a plurality of contact layers are used to partition the portion of the stress film 24 that is located on the source/drain region 21a. Each of the contact layers C1-1 and C1-2 has, for example, a square planar configuration. The number of contact layers provided on the source/drain region 21a is not limited to two, but may be more than two.

The smaller the distance between the contact layers C1-1 and C1-2, the better. Note that in the third embodiment, the distance therebetween is set to the same value as the width of the contact layer C1-1 because of the limitations in the manufacturing process. The two contact layers C1-1 and C1-2 are located at positions near the Y-directional opposite ends of the p-type well 13.

Similarly, two contact layers C2-1 and C2-2 are provided on the source/drain region 21d of the p-type well 13 that is located at the other end of the well 13. Each of the contact layers C2-1 and C2-2 has, for example, a square planar configuration. The height of the contact layers C1-1, C1-2, C2-1 and C2-2 is set at least higher than the upper surface of the stress film 24.

Also in the semiconductor device constructed as above, the channel regions of the n-type MISFETs provided in and on the p-type well 13 can produce substantially equal tensile stress. This device has other advantages that are similar to those described in the second embodiment.

Furthermore, the structure of the third embodiment is also applicable to the device of the first embodiment. Namely, each contact layer extending in the Y direction may be formed of a plurality of contact layers.

Fourth Embodiment

Figure 8:
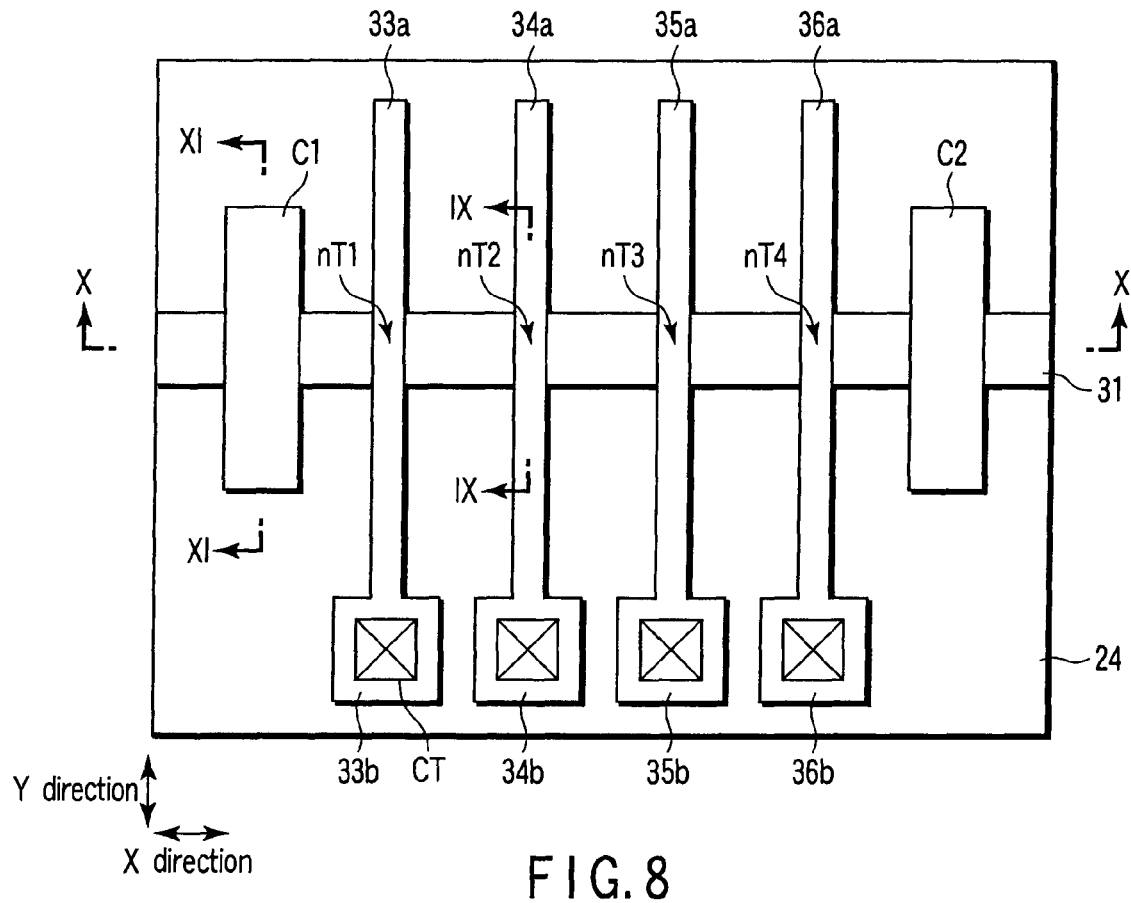
FIG. 8 is a plan view illustrating a semiconductor device according to a fourth embodiment of the invention.
Figure 9:
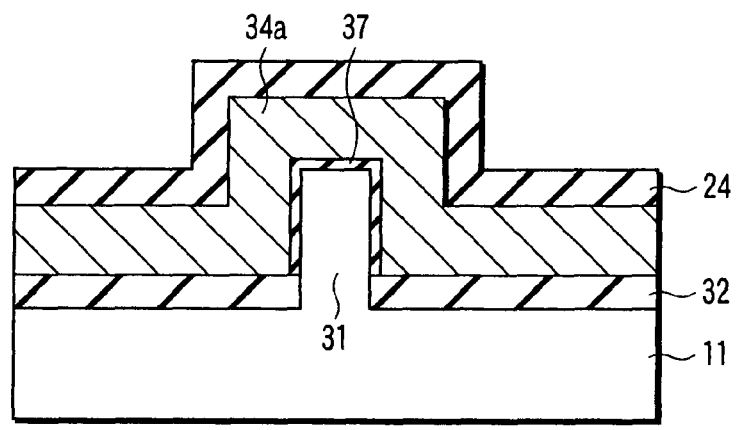
FIG. 9 is a sectional view taken along line IX-IX in FIG. 8.
Figure 10:
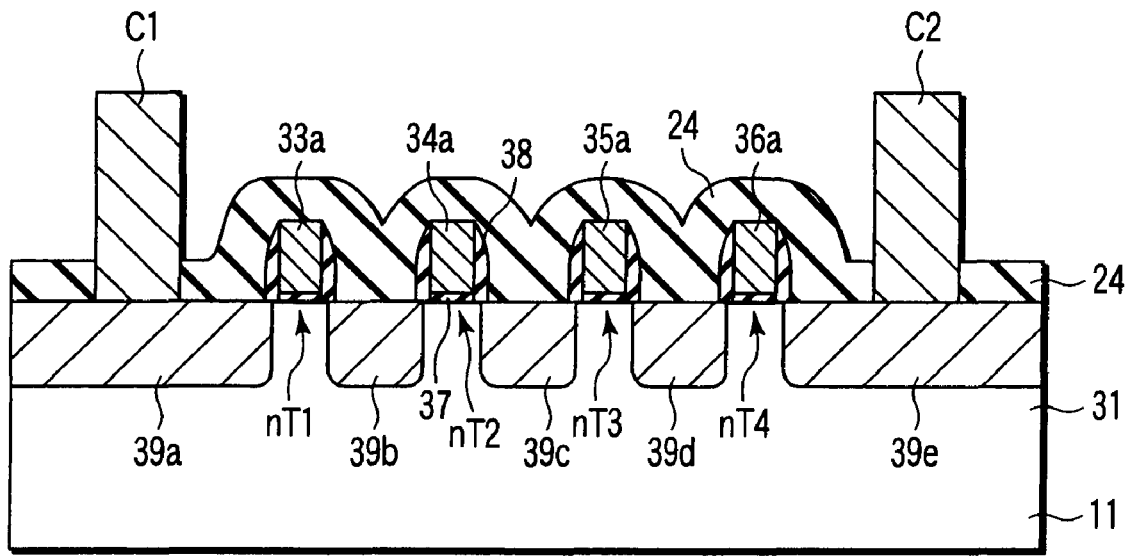
FIG. 10 is a sectional view taken along line X-X in FIG. 8.
Figure 11:
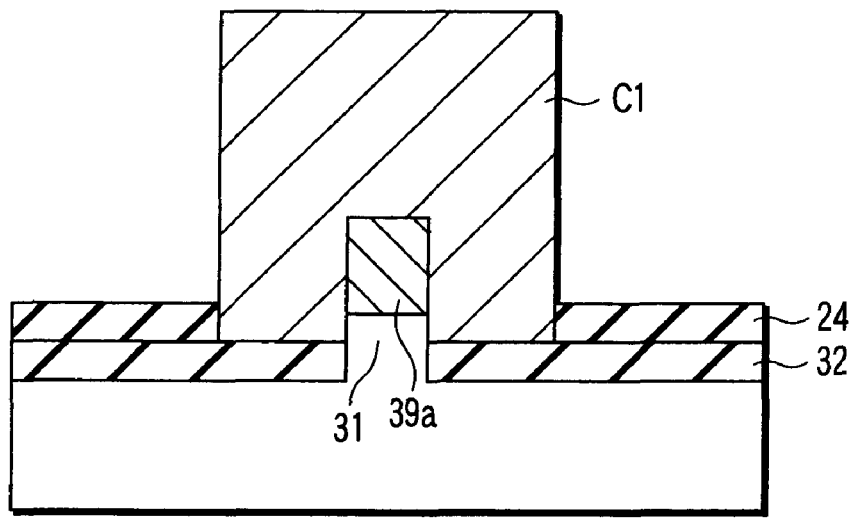
FIG. 11 is a sectional view taken along line XI-XI in FIG. 8.

FIG. 8 is a plan view illustrating a semiconductor device according to a fourth embodiment of the invention. FIG. 9 is a sectional view taken along line IX-IX in FIG. 8. FIG. 10 is a sectional view taken along line X-X in FIG. 8. FIG. 11 is a sectional view taken along line XI-XI in FIG. 8.

As shown in FIG. 9, an X-directionally extending convex semiconductor layer (hereinafter referred to as "the fin") 31 is provided on the p-type semiconductor substrate 11. The fin 31 has the same conductivity as the p-type semiconductor substrate 11, and is formed of the same material as the substrate 11. The fin 31 has an upper surface and opposite side surfaces which are extend in the X direction. An element isolation region (STI) 32 is provided on the semiconductor substrate 11 to cover the lower portion of the fin 31.

Four gate electrodes 33a, 34a, 35a and 36a are provided on the upper surface and opposite side surfaces of the fin 31 with gate insulation films 37 interposed therebetween, such that they extend in the Y direction. The gate electrodes 33a, 34a, 35a and 36a are arranged at regular distances.

As shown in FIG. 8, conductive layers 33b, 34b, 35b and 36b formed of the same material as the gate electrodes are provided at respective ends of the gate electrodes 33a, 34a, 35a and 36a. Contact layers CT for enabling the gate electrodes to have a certain potential is provided on the conductive layers 33b, 34b, 35b and 36b. The conductive layers 33b, 34b, 35b and 36b are provided to allow for a margin of misalignment of the contact layers CT when they are formed.

Gate side-wall insulation films 38 (formed of, for example, $SiO_2$) are provided on the opposite sides of the gate electrode 33a. Source/drain regions 39a and 39b as $n^+$-type diffusion regions are provided in the fin 31 at the opposite sides of the gate electrode 33a.

The n-type MISFET nT1 including the gate electrode 33a is constructed as the above. The same can be said of the n-type MISFETs nT2, nT3 and nT4. A single source/drain region is used by two adjacent n-type MISFETs. Namely, the n-type MISFET nT2 comprises the gate electrode 34a and source/drain regions 39b and 39c. The n-type MISFET nT3 comprises the gate electrode 35a and source/drain regions 39c and 39d. The n-type MISFET nT4 comprises the gate electrode 36a and source/drain regions 39d and 39e.

In the fin-type MISFET constructed as the above, the upper surface and opposite side surfaces of the fin 31 can be used as channel regions. As a result, the MISFET can be reduced in size and suppressed in short-channel effect.

A stress film 24 for causing the channel regions of the n-type MISFETs nT1 to nT4 to produce tensile stress is provided on the shallow trench 32 and fin 31 to cover the n-type MISFETs. The stress film 24 on the n-type MISFETs can cause the channel region just below the gate electrode 33a (34a, 35a, 36a) to produce tensile stress. Namely, the mobility of carriers (electrons) in the n-type MISFETs is enhanced, thereby enhancing the current driving capacity of the n-type MISFETs. An interlayer dielectric film (not shown) is provided on the stress film 24.

Y-directionally extending contact layers C1 and C2 are provided at the opposite sides of the n-type MISFETs nT1 to nT4. In other words, the n-type MISFETs nT1 to nT4 are interposed between the contact layers C1 and C2. More specifically, the contact layers C1 and C2 are provided on the upper surface and opposite sides of the fin 31. Further, the contact layer C1 is provided on the source/drain region 39a, while the contact layer C2 is provided on the source/drain region 39e. The height of the contact layers C1 and C2 is set at least higher than the upper surface of the stress film 24.

The contact layer C1 partitions the portion of the stress film 24 that is located on the source/drain region 39a, while the contact layer C2 partitions the portion of the stress film 24 that is located on the source/drain region 39e.

The stress film 24 causes the channel regions of the n-type MISFETs nT1 and nT4 located at the X-directional opposite ends to produce great stress. This is because at the X-directional opposite ends, there are no elements that interrupt the influence of the stress film.

In the fourth embodiment, the portions of the stress film 24 located at the X-directional opposite sides of the n-type MISFETs nT1 to nT4 are partitioned by the contact layers C1 and C2, whereby the channel regions of the n-type MISFETs nT1 to nT4 can be caused to produce substantially equal tensile stress. As a result, the mobility of carriers (electrons) in the n-type MISFETs can be substantially equally enhanced, thereby substantially equally enhancing the current driving capacity of the n-type MISFETs.

If the contact layer C1 connected to the source/drain region 39a, and the contact layer C2 connected to the source/drain region 39e are located closer to the n-type MISFETs nT1 and nT4, respectively, the semiconductor device can be reduced in size.

The fourth embodiment is also applicable to the case where p-type MISFETs are formed in an n-type fin.

There are no particular limitations on the structure of the fin-type MISFET. The fourth embodiment employs, as an example, a fin-type MISFET of a tri-gate structure in which the upper and opposite sides of the fin 31 are used as channel regions. However, it may employ, as another example, a fin-type MISFET of a double-gate structure in which the opposite sides of the fin 31 are used as channel regions. In the double-gate-structure fin-type MISFET, two gate electrodes are provided on the opposite sides of the fin 31 via gate insulation films.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and the equivalents.

What is claimed is:

1. A semiconductor device comprising:
   a substrate;
   a semiconductor layer provided on the substrate, extending in a first direction, and including an upper surface and opposite side surfaces;
   a group of transistors including a plurality of MIS transistors and provided in the semiconductor layer;
   an insulation film provided on the group of transistors; and
   a first contact layer and a second contact layer provided on the upper surface and the opposite side surfaces of the semiconductor layer at opposite sides of the group of transistors, and extending in a second direction perpendicular to the first direction,
   wherein the first and second contact layers have a length larger than a width of the semiconductor layer.

2. The semiconductor device according to claim 1, wherein the MIS transistors include a plurality of gate electrodes provided on the semiconductor layer via gate insulation films and extending in the second direction.

3. The semiconductor device according to claim 1, wherein:
   each of the MIS transistors includes two source/drain regions provided in the semiconductor layer;
   the first contact layer is provided on a source/drain region of one of the MIS transistors which is located at one end of the group of transistors; and
   the second contact layer is provided on a source/drain region of one of the MIS transistors which is located at another end of the group of transistors.

4. The semiconductor device according to claim 1, wherein:
   the semiconductor layer is of a p-type;
   the MIS transistors are of an n-type; and
   the insulation film causes channel regions of the MIS transistors to produce tensile stress.

5. The semiconductor device according to claim 1, wherein:
   the semiconductor layer is of an n-type;
   the MIS transistors are of a p-type; and
   the insulation film causes channel regions of the MIS transistors to produce compressive stress.

6. The semiconductor device according to claim 1, wherein the first and second contact layers have a rectangular planar configuration.

* * * * *